(12) United States Patent
Burlison et al.

(10) Patent No.: US 7,650,547 B2
(45) Date of Patent: Jan. 19, 2010

(54) APPARATUS FOR LOCATING A DEFECT IN A SCAN CHAIN WHILE TESTING DIGITAL LOGIC

(75) Inventors: Phillip D. Burlison, Morgan Hill, CA (US); John K. Frediani, Corralitos, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 242 days.

(21) Appl. No.: 11/680,134

(22) Filed: Feb. 28, 2007

(65) Prior Publication Data

US 2008/0209288 A1 Aug. 28, 2008

(51) Int. Cl.
*G01R 31/3183* (2006.01)
*G01R 31/40* (2006.01)

(52) U.S. Cl. ...................... 714/726; 714/724

(58) Field of Classification Search ........................ None
See application file for complete search history.

(56) References Cited

U.S. PATENT DOCUMENTS

| | | | | | |
|---|---|---|---|---|---|
| 4,255,789 | A | * | 3/1981 | Hartford et al. | 701/108 |
| 5,657,232 | A | * | 8/1997 | Ishikawa et al. | 701/215 |
| 5,951,705 | A | * | 9/1999 | Arkin et al. | 714/738 |
| 6,662,324 | B1 | * | 12/2003 | Motika et al. | 714/726 |
| 6,947,484 | B2 | * | 9/2005 | Inagaki et al. | 375/240.02 |
| 6,966,021 | B2 | * | 11/2005 | Rajski et al. | 714/726 |
| 2005/0055615 | A1 | * | 3/2005 | Agashe et al. | 714/727 |
| 2005/0172188 | A1 | | 8/2005 | Burdine | 714/726 |
| 2006/0075316 | A1 | | 4/2006 | Chindamo et al. | 714/726 |
| 2006/0095818 | A1 | | 5/2006 | Bratt et al. | 714/726 |
| 2007/0016833 | A1 | | 1/2007 | Lin | 714/724 |
| 2007/0220384 | A1 | * | 9/2007 | Bartenstein et al. | 714/726 |
| 2008/0215940 | A1 | * | 9/2008 | Burlison et al. | 714/726 |

OTHER PUBLICATIONS

U.S. Appl. No. 11/609,899, filed Dec. 12, 2006, Dokken.

* cited by examiner

*Primary Examiner*—Kevin L Ellis
*Assistant Examiner*—Dipakkumar Gandhi
(74) *Attorney, Agent, or Firm*—Holland & Hart, LLP (57) ABSTRACT

An apparatus for locating a defect in a scan chain by recording the last bit position in a serial data stream at which a certain data state is observed during a test comprising a plurality of patterns.

6 Claims, 11 Drawing Sheets

Figure 1 – IC Without DFT

Figure 6 – IC With Scan Chain Defect

```
                         1      5        10        15        20        25     30
                         |------^---------^---------^---------^---------^------|
• Serial Pattern #1:    1010111000101000000000000000000
• Serial Pattern #2:    0110011000000000000000000000000
• Serial Pattern #3:    1010000101010100000000000000000
• Serial Pattern #4:    0010010101111010000000000000000
• Serial Pattern #5:    1000100111110010000000000000000
• Serial Pattern #6:    0101011000010010000000000000000
• Serial Pattern #7:    1000000100100100000000000000000
• Serial Pattern #8:    1101001001101000000000000000000
• Serial Pattern #9:    0111001010101010000000000000000
```

Figure 10 – Flow for Testing and isolating stuck-at faults in scan chains

Figure 11 – 4 bit Magnitude Comparator

APPARATUS FOR LOCATING A DEFECT IN A SCAN CHAIN WHILE TESTING DIGITAL LOGIC

FIELD OF THE INVENTION

The testing of the digital logic in complex semiconductor integrated circuits commonly utilizes Design For Test (DFT) circuitry comprising scan chains which may themselves be defective. The field of the invention is testing the test circuitry in digital logic semiconductor devices on an Automatic Test Equipment apparatus augmented with the present invention whereby a defect in a scan chain may be located and analyzed.

BACKGROUND

Digital logic consists of combinational logic functions and sequential logic functions. In combinational logic functions, the digital output(s) is determined by the present data state of its input data signals. Any change in an input data state of combinational logic function results in an immediate change in the function's output data state. Examples of these combinational logic functions are AND gates (a TRUE state on ALL inputs results in a TRUE state on the output), OR gates (a TRUE state on ANY input results in a TRUE state on the output), and Multiplexers (the output state is derived from one of a set of inputs that is selected from another set of inputs). Sequential logic functions differ in that the output data state (Q) can maintain a data state that is dependent on the input data states that were applied in the past. The most commonly used sequential function in logic designs is the flipflop. The flipflop's output data (Q) state changes only when there is a positive transition on its input clock (C) signal. At the time of this transition, the output data (Q) state changes to the state on its input data (D) signal. After the clock signal transition, the output (Q) maintains its state regardless of the data input data state. Each clock transition is referred to as a data cycle. Normally these data cycles occur at regularly scheduled intervals which represent the effective data rate of the circuit. Normal operation of the circuit will typically involve millions of data cycles.

Figure 1:
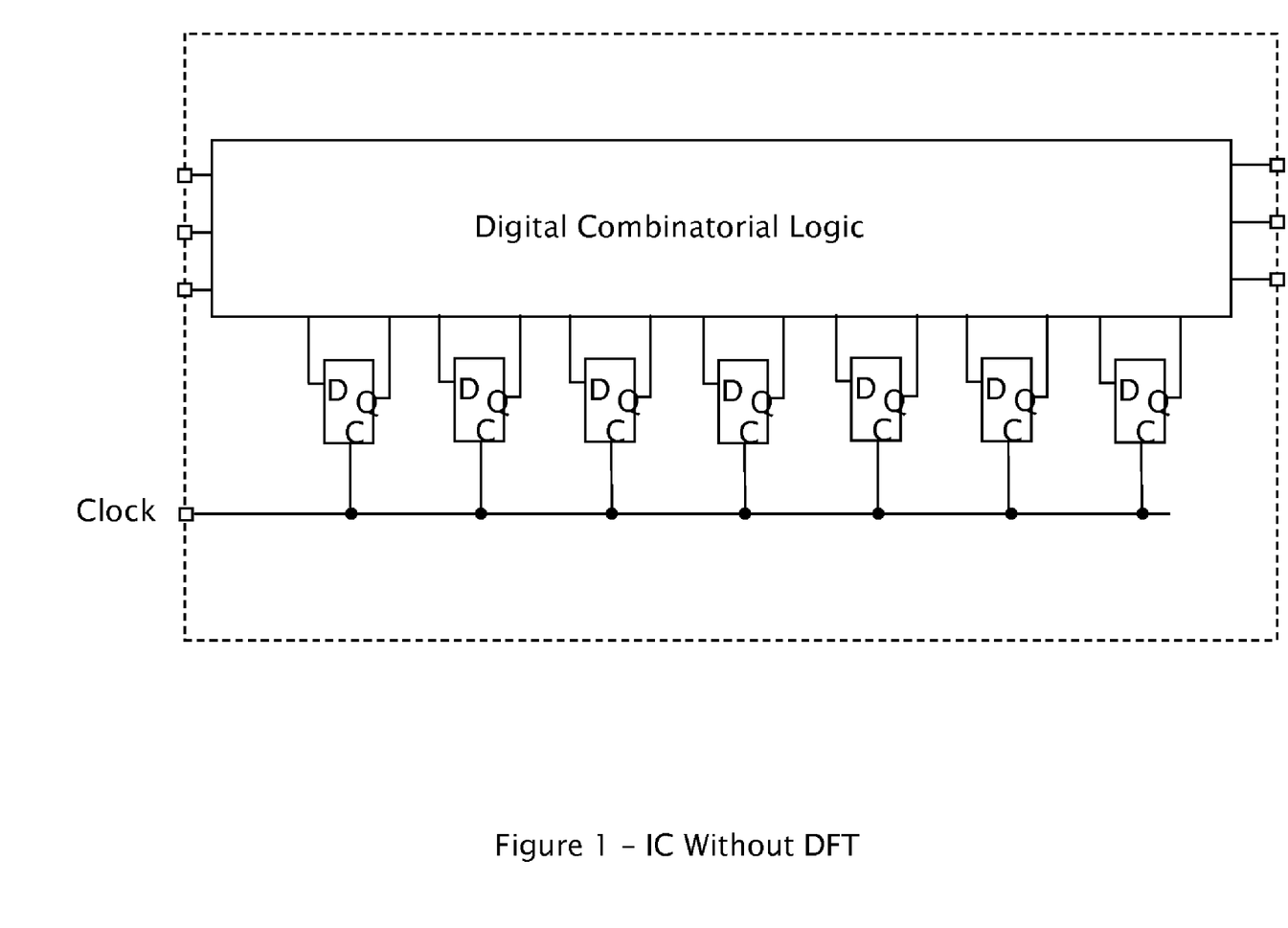
FIG. 1 is an illustrative schematic of an IC without DFT circuitry
Figure 2:
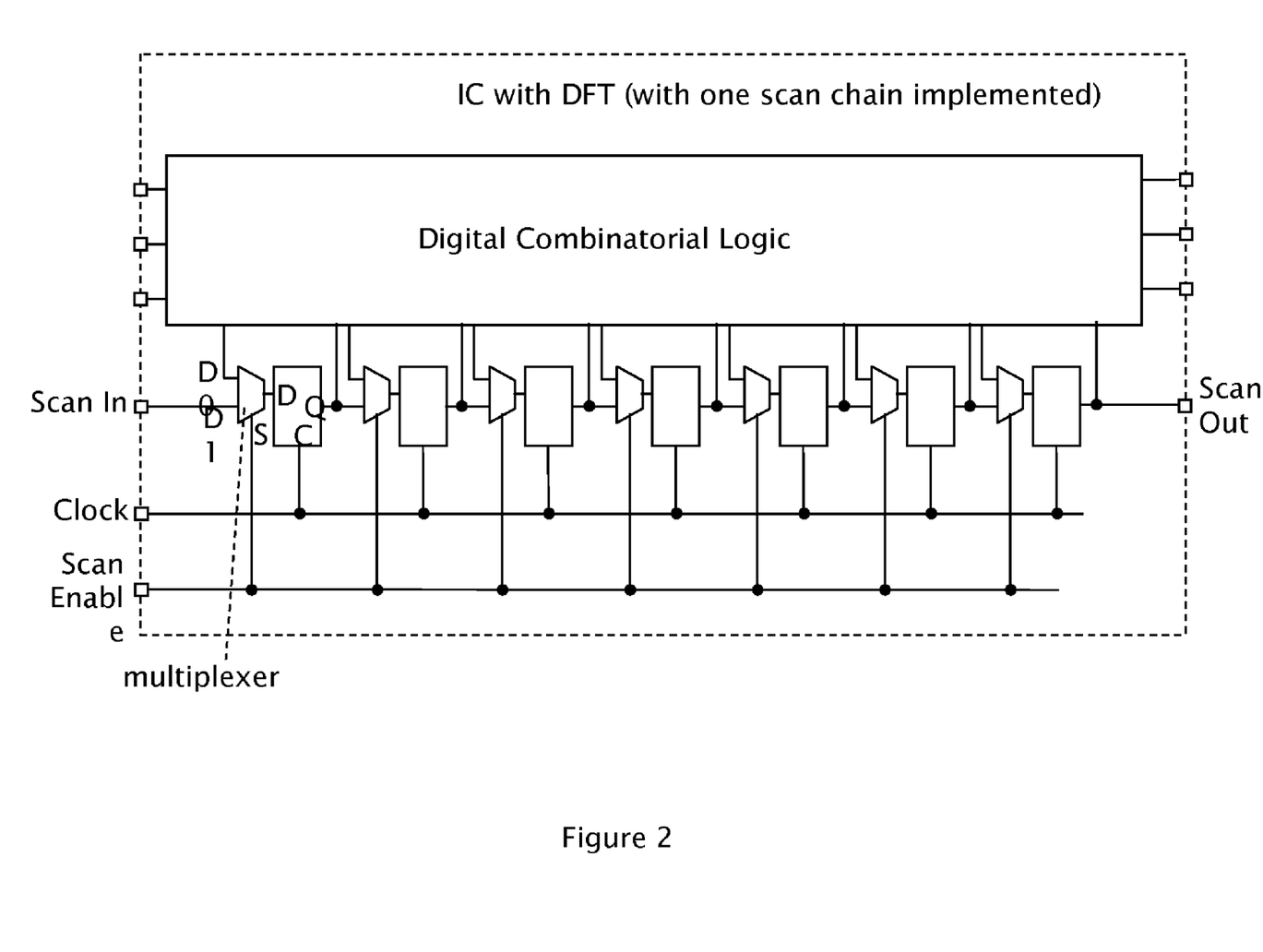
FIG. 2 is a schematic illustrating an IC with DFT circuitry
Figure 3:
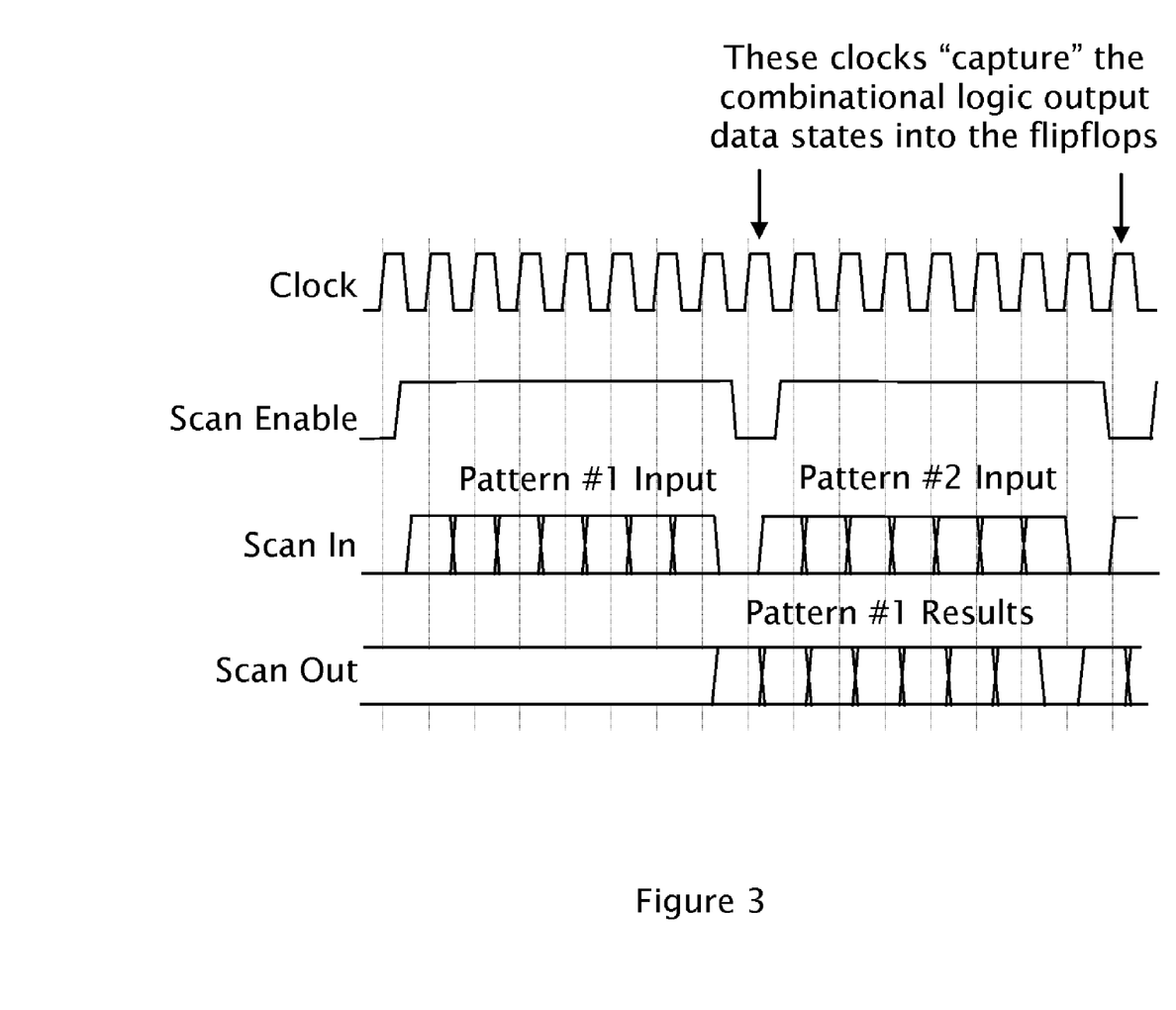
FIG. 3 is waveform of DFT clock, control, and data signals

To add testability to a circuit, flipflops are modified to facilitate the setting and reading of their data states using a data path that is independent of the functional combinational logic. This is referred to as Design For Test (DFT). FIG. 1 depicts a circuit element consisting of four (4) flipflops with the combinational logic enclosed in a "black box" for simplicity. FIG. 2 depicts the same circuit with a scan chain implemented. This implementation involves adding a signal multiplexer in the data input (D) of each flipflop. A single control signal called Scan Enable is added to control the selection of these multiplexers. When the Scan Enable signal is low, the circuit works as normal, meaning the data input to the flipflops comes from the combinational logic. When scan enable is set to a "1" state, the input of each flipflop is connected to the output of another flipflop. The data input to the first flipflop in this scan chain is brought out to an external pin of the device. Likewise the data output of the last flipflop in the chain are brought out to an external pin (Scan Out of the device. FIG. 3 depicts how this implementation facilitates the shifting in of a test pattern on the Scan In pin to every flipflop in the circuit. After the test pattern is shifted in, the Scan Enable signal is brought low for one cycle and the data outputs of the combinational logic resulting from the shifted in test pattern is captured in the flip-flops. The Scan Enable signal is then brought back high and the captured data results are shifted out of the Scan Out pin and compared against expected results by the tester. Any operational defect in the combinational logic will cause one or more bits of the data output sequence to differ from the expected results.

Building upon the illustration of the principle discussed above, a typical IC design might implement thousands of flipflops in each scan chain, and employ multiple scan chains across the IC. Also there are commonly several thousand different scan patterns applied in a test (a single pattern refers to the complete set of sequential data that is shifted into each flipflop, requiring that each pattern contain one unique data state for each flip-flop in the design). This results in an extremely large volume of test data that is applied to and tested for during the testing of a complex IC. Moreover the multiple scan chains within a device will rarely if ever have exactly identical length so a test pattern will frequently have don't cares.

Figure 4:
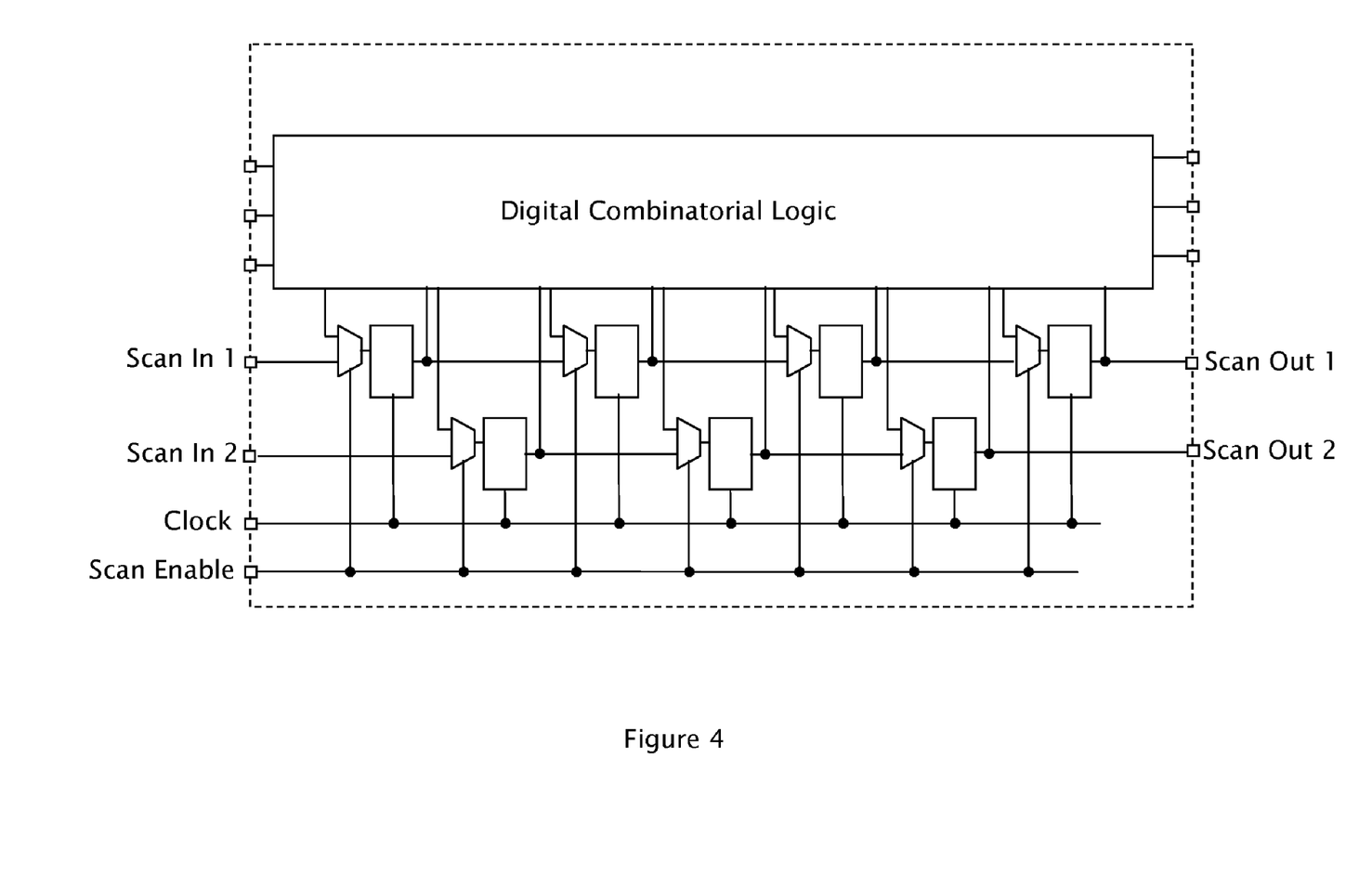
FIG. 4 is a schematic illustrating two scan chains
Figure 5:
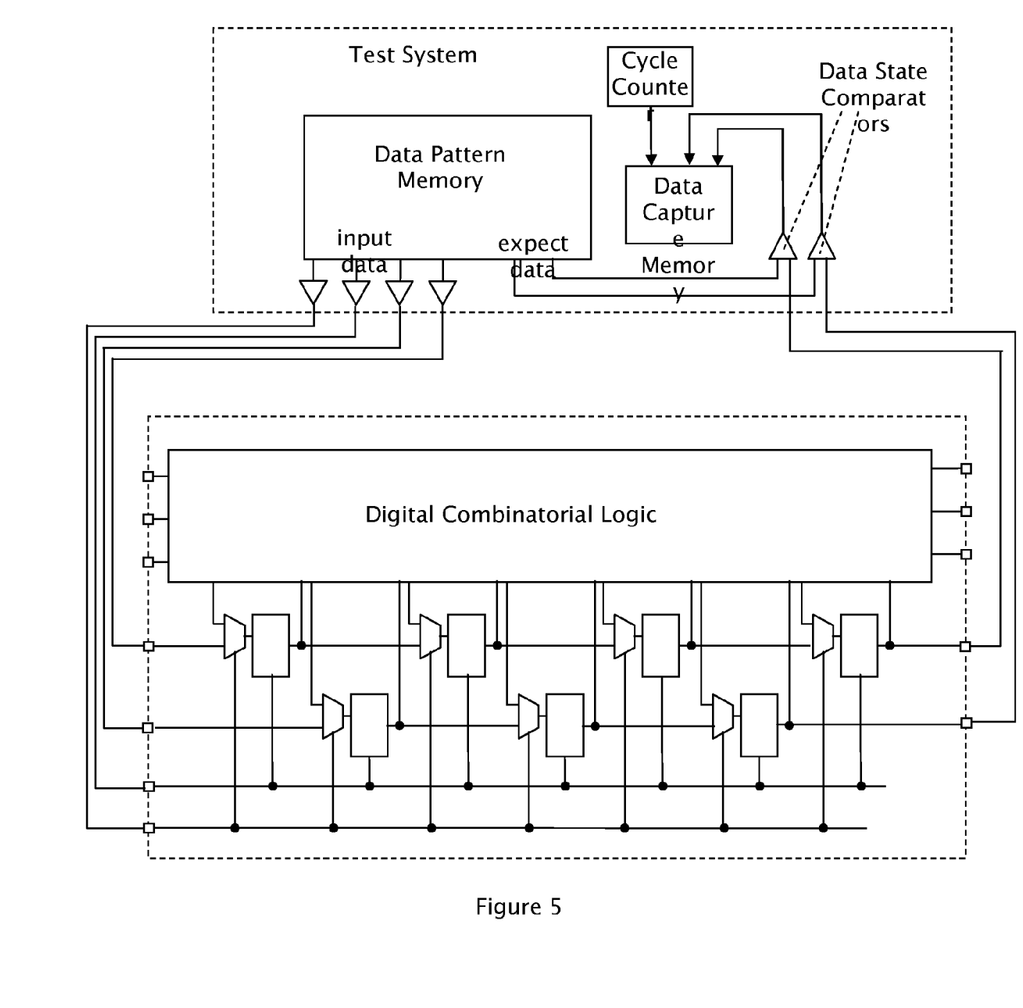
FIG. 5 is a schematic of a test system and a device under test

The role of IC test may to verify that an IC is free of any manufacturing defects. During the execution of a test pattern, if a data state is detected that is different then the expected data state, it may be economical to terminate the test and categorize the IC as defective. However it may be desirable to capture all failing data states in all patterns for the purpose of subsequently diagnosing the failures to determine which combinational logic element caused the fault. This diagnosis is normally done by a separate software program that analyzes the results captured by the automatic test equipment. The automatic test equipment must also be able to record the required information required to perform this post analysis process. FIG. 4 illustrates a chip with multiple scan chains. FIG. 5 depicts a conventional tester that facilitates this. A Data Pattern Memory is loaded with the test patterns to be applied to the IC, plus the data pattern expected to be read out of the IC. A tester may have a selectable modes either to terminate the test whenever an error occurs (an output data state differs from the expected data state), or to complete the entire pattern set and record all of the errors that were observed. To accomplish this, a tester would have a Data Capture Memory. This memory records the data cycle count and the output pin an error is observed on. Another mode of the Data Capture Memory is to record the actual states read from the IC outputs.

A single fault in the combinational logic may create several thousand errors to be potentially recorded in a data capture memory. As an example consider an IC design that has 20,000 flipflops in each scan chain, and applies 10,000 patterns. A single combinational logic fault might cause 10 flipflops to fail in 25% of the patterns. This would result in 25,000 failures being recorded in the Data Capture Memory. While non-trivial, this data can be managed to a reasonable degree and "datalogged" to a file for post processing to determine the location of the combinational logic fault.

Figure 6:
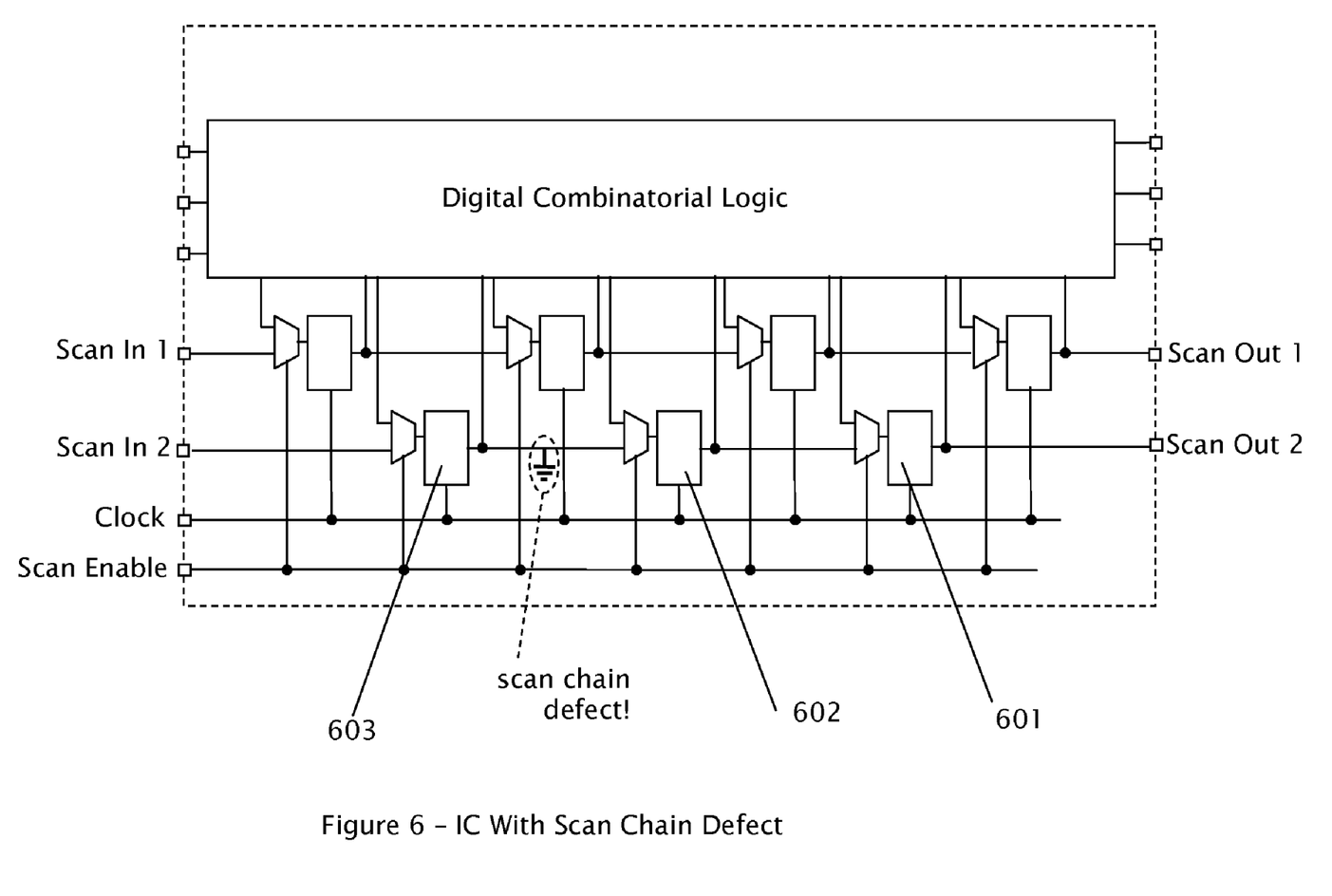
FIG. 6 is a schematic illustrating a defect in a scan chain

However, a fault that exists in a scan chain path itself creates a significantly different diagnosis problem. FIG. 6 depicts the same example IC described before but with a "Short" at the input of the multiplexor going into flipflop #602. This defect will cause all scan in data to be "stuck-at" a "0" state in flipflops #601 and #602. This defect has two repercussions, 1) the test pattern applied to the combinational logic is invalid, and 2) upon scanning out, the blockage causes the inability to observe any data captured in flip-flop #603. The result is a tremendous number of fails.

Figure 7:
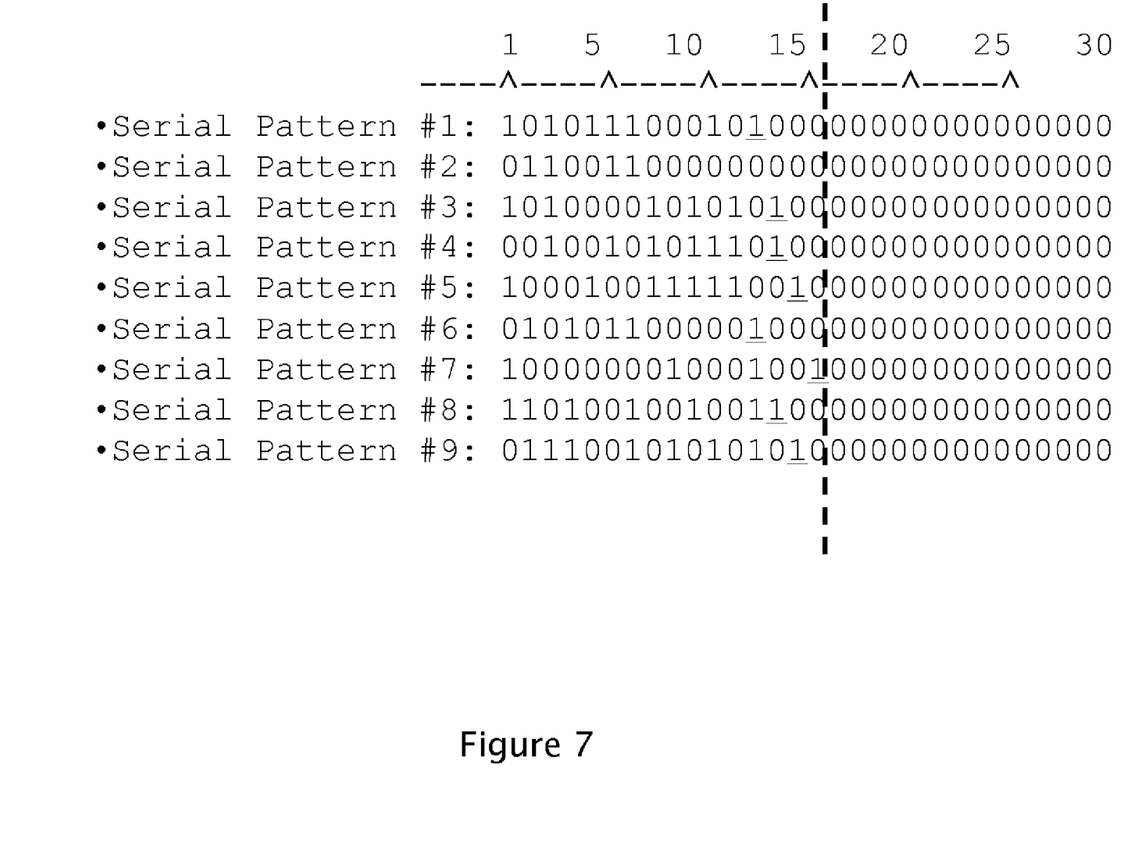
FIG. 7 is a data log of output patterns from a defective scan chain

This defect can be isolated by the following method. Consider an example device that has 30 flipflops and a defect exists that causes a "stuck-at" state of "0" at the input to flipflop #16. When applying the set of test patterns to the device, the "capture" events will capture non-deterministic data states from the combinations in all flipflops (the data is non-deterministic because of the invalid test pattern data after flipflop #15). The non-deterministic "0" and "1" data states captured in flipflops #1-15 will be observed when shifting out the data, but all captured data after flipflop #15 will be read as "0" data states. By observing at what cycle location in the output data stream that data stops transitioning between "1"'s and "0"'s and becomes a constant data state one could estimate at which flipflop the fault exists. FIG. 7 depicts an example of the data out pattern that might be observed in this example. Note that multiple patterns must be applied to determine the fault location since the non-deterministic data state in the observable flipflops might contain "0" data states. The estimate is not accurate until pattern #7 in the example. By executing a large number of patterns a higher degree of confidence is obtained. The disadvantage in this method is the large amount of data that must be recorded in the tester's data capture memory and analyzed. In the example where there are 20,000 flipflops in a chain, and 1000 patterns applied, 2,000,000 data states are captured and analyzed.

Thus it can be appreciated that what is needed is a way of determining a location of a fault in a scan chain without capturing, recording and analyzing millions of test failure data values.

SUMMARY OF THE INVENTION

The apparatus has means for recording the bit locations of the last "1" or the last "0" shifted out of a scan chain which is suspected of having a blockage.

DETAILED DESCRIPTION

Diagnosing a fault in a scan chain can be effectively performed if the non-deterministic data from the scan chain is observed as it is being read out of the device. This dynamically captures the last data state transition without having to record all failures into a data capture memory. The invention is an apparatus which observes the data state being read and records the last data state bit position in the data stream where "0" and "1" data states are observed.

Figure 8:
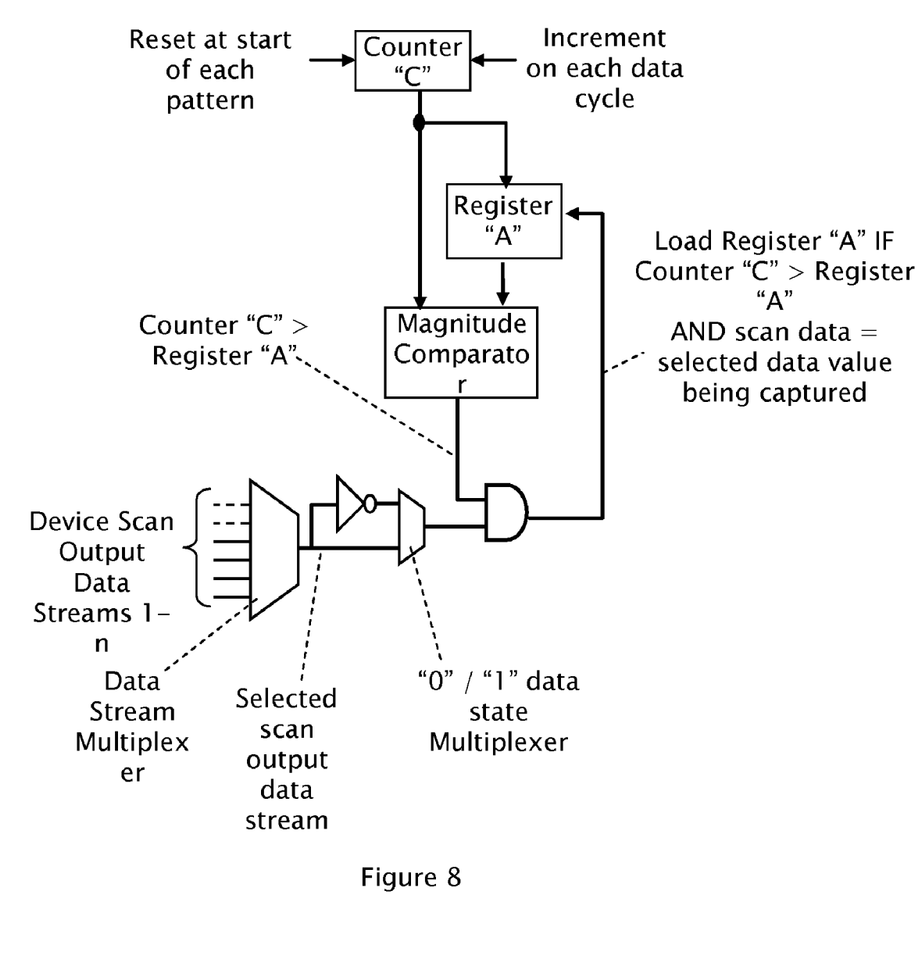
FIG. 8 is a schematic of the invention

Referring to FIG. 8, the present invention is an apparatus comprising a means for representing the current pattern number, in an embodiment the means for representing the current pattern number being a counter "C" reset at the start of each pattern and incremented on each data cycle, coupled to a register "A" and further coupled to a magnitude comparator, the magnitude comparator further coupled to means for loading the register "A" if the counter "C" exhibits a value greater than the value exhibited by the register "A" AND scan data being shifted out of a scan chain is equal to the selected scan data value being captured, in an embodiment, a logic gate coupled to the load control of the register and operating on the result of the magnitude comparator as one operand and the output of a selector controlling the normal or complement value of a selected scan output data stream as the other operand. The purest form of the invention shown here depends on external determination of the value of the stuck-at defect being stuck-at-one or stuck-at-zero.

Figure 9:
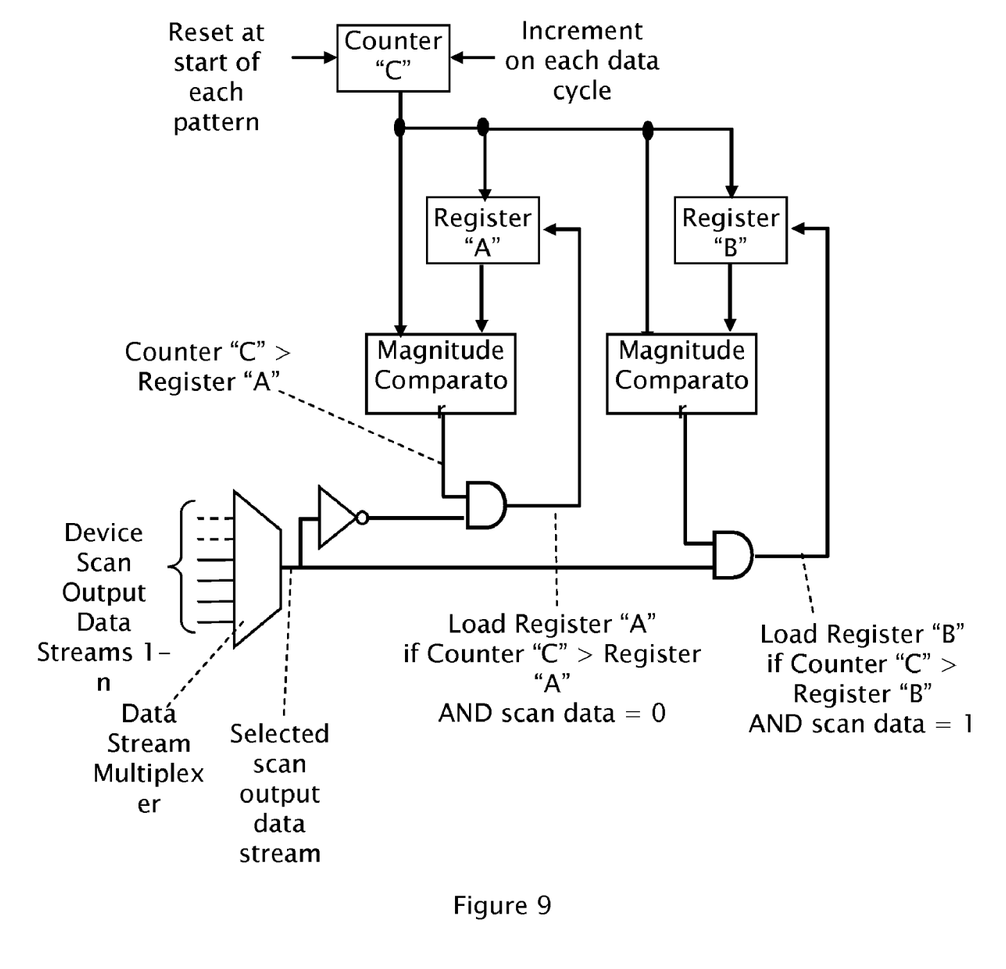
FIG. 9 is a schematic of an embodiment of the invention

In FIG. 9, an embodiment comprises two of the invention instantiated to record both the last one and the last zero emitted from the scan chain. A counter provides means for representing the current pattern number being reset at the start of each pattern and incremented on each data cycle state. The counter is coupled to a first register and to a second register and further coupled to a first magnitude comparator and a second magnitude comparator.

In an embodiment the means for loading the registers comprise a pair of gates comprising a first gate loading the register "A" if the counter "C" exhibits a value greater than the value exhibited by the register "A" AND scan data being shifted out of a scan chain is zero and a second gate loading the register "B" if the counter "C" exhibits a value greater than the value exhibited by the register "B" AND scan data being shifted out of a scan chain is one. FIG. 9 shows a selector allowing the apparatus to operate on the output of a plurality of scan chains, a further embodiment.

The apparatus further has means for resetting the counter "C" at the start of each pattern and means for incrementing the value of the counter "C" on each data cycle.

The apparatus further has means for reading out the values of Register "A" and Register "B" at the conclusion of a plurality of patterns. The values of A and B being unequal is consistent with a stuck at defect in a scan chain, the smaller of the two being approximate location of the defect.

The invention is also an apparatus for dynamically determining the last data state transition sensed while unloading a scan chain comprising means for observing the data state of the scan output, means for recording the bit position of each scan output, means for loading a first register with the bit position of the last scan output "0" and means for loading a second register with the bit position of the last scan output "1".

Only one register and one comparator is needed if the tester independently signals that the defect is a stuck-at-one or stuck-at-zero, in which case the present invention is an apparatus for determining the location of a stuck-at one or stuck-at zero defect in a scan chain controlled by a scan clock to shift data on a scan out pin of a device under test in a scan test comprising a plurality of scan patterns, comprising means for storing the largest bit position of the scan out vector having a complement of a stuck-at value, means for representing the current bit position of a current scan pattern in a scan test comprising a plurality of scan patterns, and means for determining if the current bit position of a current scan pattern is greater than the largest bit position stored in a scan test.

Figure 10:
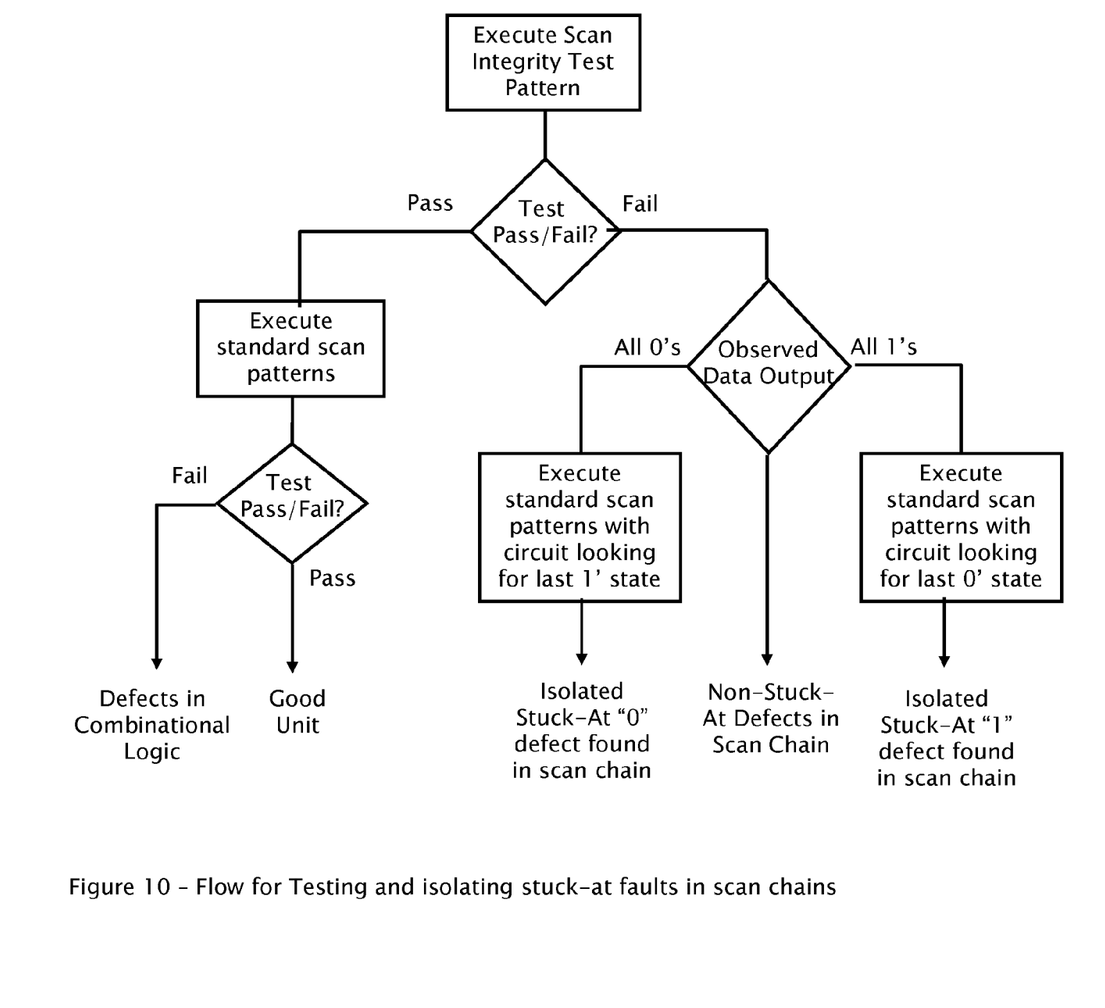
FIG. 10 is a flowchart for testing and isolating faults in scan chains

An example flow in which the invention would be invoked is depicted in the flow chart in FIG. 10 and flows as follows: 1) A "Chain Integrity" test is performed where a arbitrary data pattern (e.g. "11001100 . . . ") is shifted into the scan in pin of each scan chain and n cycles later (n being the # of flipflops in the scan chain) the scan out pin is tested to confirm it matches the input pattern. 2) If this pattern passes, then flow continues on to the standard scan test patterns for the combinational logic. 3) else if the scan integrity test pattern fails and the observed data output pattern is all 0's, then the standard combinational test patterns are performed with the invention set up to observe the last "1" data state as described below. 4) else if the scan integrity test pattern fails and the observed data output pattern is all 1's, then the standard combinational test patterns are performed with the invention set up to observe the last "0" data state as described below. 5) if the scan integrity test pattern fails and the observed data output pattern consists of both 0 and 1 data states, this indicate the defect is not a "stuck-at" defect and the test is terminated.

Figures 4, 11:
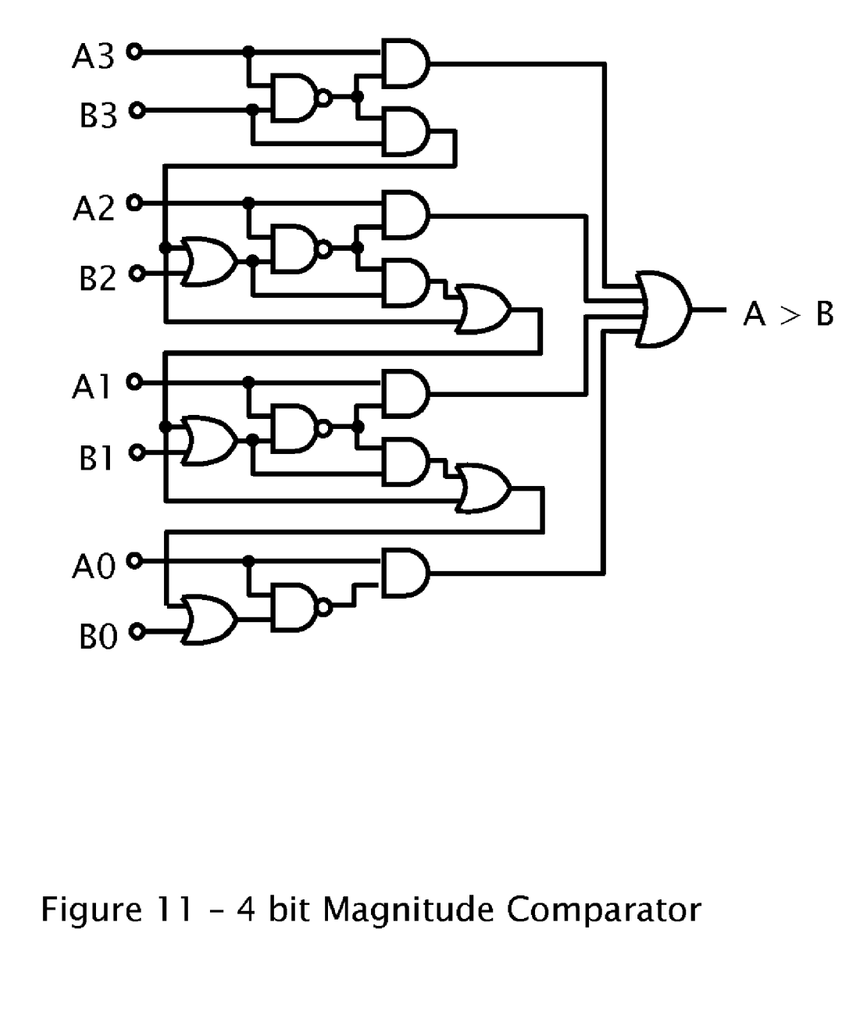
FIG. 11 is a schematic illustrating a magnitude comparator circuit

An embodiment of a means for determining if the current bit position of a current scan pattern is greater than the largest bit position stored in a scan test is a magnitude comparator, known to those skilled in the art of logic design, easily synthesized from a hardware description language of selected bitwidth by conventional design automation tools, and shown as FIG. 11 as an example in a four bit embodiment.

An embodiment of a means for representing the current bit position of a current scan pattern comprises one of the following, means for reading the current bit position from the tester control processor, a counter controlled by the scan clock and reset by the tester control processor at the start of each scan pattern, and an incrementer controlling the scan clock.

An embodiment of a means for storing the largest bit position of the scan out vector having a complement of a stuck-at value, comprises one of the following: a register loaded when the complement of the stuck-at value is equal to the scan out value and the current bit position of a current scan pattern is greater than the largest bit position stored in a scan test, a latch that is released when the current bit position of a current scan pattern is greater than the largest bit position stored in a scan test and set when the complement of the stuck-at value is not equal to the scan out, and a memory location written to with the value of the bit position for each scan out equal to the complement of the stuck-at value. The means for storing the largest bit position further comprising means for reading out the value of the stored bit position.

CONCLUSION

The invention is an apparatus for determining the location of a blockage in a scan chain comprising at least one counter, one register, means for resetting a counter at the start of each pattern, means for incrementing a counter on each data cycle, means for loading a register with the value of the counter when the scan output data is equal to the stuck-at value.

Given foreknowledge if the stuck-at defect is a stuck-at-one or stuck-at-zero, the invention is strictly an apparatus for locating a stuck-at defect in a scan chain of a semiconductor device under test controlled by a scan clock during a test applying a plurality of scan patterns, comprising means for representing the current bit position of a scan pattern being shifted out of a scan chain, means for storing the largest bit position having the complement of the stuck-at value shifted out of the scan chain, and means for determining if the current bit position is greater than the largest bit position stored in a scan test.

The embodiments provided above are only illustrative of the invention fully disclosed by the claims following. The scope of the invention should be determined by the appended claims and their legal equivalents.

What is claimed is:

1. An apparatus for locating a stuck-at defect in a scan chain of a semiconductor device under test controlled by a scan clock during a test applying a plurality of scan patterns, comprising:

means for representing a current bit position of a scan pattern being shifted out of a scan chain;

means for storing the current bit position when the current bit position is a largest bit position having the complement of a stuck-at value being tested for at an output of the scan chain, wherein each bit position of the scan pattern being shifted out of the scan chain has a larger bit position than a previous bit position shifted out of the scan chain; and means for determining if the current bit position is greater than the largest bit position stored in a scan test.

2. The apparatus of claim 1, further comprising means for resetting the counter "C" at the start of each pattern and means for incrementing the value of the counter "C" on each data cycle.

3. An apparatus, comprising:

at least one register;

a counter "C" coupled to the at least one register;

at least one magnitude comparator to which the counter is coupled, the magnitude comparator further coupled to the register whereby the magnitude comparator emits a signal that changes from a digital "0" to "1" state when the value of the counter "C" is greater than the value of the register; and means for loading the register with the value of the counter "C" when the value of the counter "C" is greater than the value of the register and the scan output data has the value of a stuck-at defect being tested for.

4. An apparatus for dynamically determining the last data state transition sensed while unloading a scan chain, comprising:

means for observing the data state of the scan output;

means for recording the bit position of each scan output;

means for loading a first register with the bit position of the last scan output "0"; and means for loading a second register with the bit position of the last scan output "1".

5. A methods, comprising the steps of:

performing a "Chain Integrity" test for a scan chain of a device under test, the "Chain Integrity" test comprising shifting an arbitrary data pattern into a scan in pin of the scan chain and observing a scan out pin of the scan chain to confirm that the arbitrary data pattern appears at the scan out pin; and after performing the "Chain Integrity" test, performing at least one of the following:

loading standard scan test patterns for combinational logic of the device under test, into the scan chain, if the "Chain Integrity" test passes;

if the "Chain Integrity" test fails and the observed data output pattern at the scan out pin during the "Chain Integrity" test is all 0' s, then applying standard combinational test patterns to the scan chain and determining, by monitoring a current bit position of a scan pattern shifted out of the scan out pin, a bit location of a last "1" data state at the scan out pin;

if the "Chain Integrity" test fails and the observed data output pattern at the scan out pin during the "Chain Integrity" test is all 1's, then applying standard combinational test patterns to the scan chain and determining, by monitoring a current bit position of a scan pattern shifted out of the scan out pin, a bit location of a last "0" data state at the scan out pin; and if the "Chain Integrity" test fails and the observed data output pattern at the scan out pin during the "Chain Integrity" test consists of both 0 and 1 data states, noting that a defect is not a "stuck-at" defect.

6. The method of claim 5, further comprising:

resetting a value of a counter at a start of each scan pattern load;

incrementing a counter on each data cycle of a scan pattern shift;

loading a first register with the value of the counter when the scan output data is "0" and the value of the counter is greater than the last stored value in the first register, and loading a second register with the value of the counter when the scan output data is "1" and the value of the counter is greater than the last stored value in the second register; and reporting a lower value of the two registers as a location abutting a blockage in the scan chain.

* * * * *

UNITED STATES PATENT AND TRADEMARK OFFICE
CERTIFICATE OF CORRECTION

PATENT NO. : 7,650,547 B2 Page 1 of 1
APPLICATION NO. : 11/680134
DATED : January 19, 2010
INVENTOR(S) : Phillip D. Burlison et al.

It is certified that error appears in the above-identified patent and that said Letters Patent is hereby corrected as shown below:

In Claim 5, "A methods, comprising the steps of:" should read --A method, comprising the steps of:--.

Signed and Sealed this

Sixteenth Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,650,547 B2  Page 1 of 1
APPLICATION NO. : 11/680134
DATED : January 19, 2010
INVENTOR(S) : Phillip D. Burlison et al.

It is certified that error appears in the above-identified patent and that said Letters Patent is hereby corrected as shown below:

Column 6, line 38, In Claim 5, "A methods, comprising the steps of:" should read --A method, comprising the steps of:--.

This certificate supersedes the Certificate of Correction issued March 16, 2010.

Signed and Sealed this

Sixth Day of April, 2010

David J. Kappos
*Director of the United States Patent and Trademark Office*